United States Patent [19]
Takahashi et al.

[11] Patent Number: 5,579,084
[45] Date of Patent: Nov. 26, 1996

[54] APPARATUS AND METHOD FOR MANUFACTURING SEMICONDUCTORS

[75] Inventors: Kazuo Takahashi, Kawasaki; Mitsuru Inoue, Yokohama, both of Japan

[73] Assignee: Canon Kabushiki Kaisha, Tokyo, Japan

[21] Appl. No.: 332,498

[22] Filed: Oct. 31, 1994

Related U.S. Application Data

[63] Continuation of Ser. No. 15,382, Feb. 9, 1993, abandoned.

[30] Foreign Application Priority Data

Feb. 21, 1992 [JP] Japan .................................. 4-070071

[51] Int. Cl.⁶ .................................................. G03B 27/42
[52] U.S. Cl. ............................ 355/53; 378/34; 188/267
[58] Field of Search .............................. 355/53, 67, 71; 378/34; 188/267; G03B 27/42

[56] References Cited

U.S. PATENT DOCUMENTS

| | | | |
|---|---|---|---|
| 3,807,078 | 4/1974 | Karnopp et al. | 248/358 R |
| 4,516,253 | 5/1985 | Novak | 378/34 |
| 4,969,624 | 11/1990 | Ustelentsev et al. | 248/550 |
| 5,100,166 | 3/1992 | Mitsui | 280/707 |
| 5,187,519 | 2/1993 | Takabayashi et al. | 355/53 |

FOREIGN PATENT DOCUMENTS

| | | | |
|---|---|---|---|
| 0382480 | 8/1990 | European Pat. Off. | B60G 17/00 |
| 0401009 | 12/1990 | European Pat. Off. | B60G 17/08 |
| 2266684 | 10/1990 | Japan | 355/53 |
| 2266683 | 10/1990 | Japan | 355/53 |

*Primary Examiner*—Safet Metjahic
*Assistant Examiner*—D. P. Malley
*Attorney, Agent, or Firm*—Fitzpatrick, Cella, Harper & Scinto

[57] ABSTRACT

A semiconductor manufacturing apparatus having a vibration insulation apparatus with a damper for insulating floor vibrations is so designed that damping characteristics of a damper can be changed. Thus, a semiconductor manufacturing apparatus capable of preventing floor vibrations from being transmitted to the apparatus and efficiently attenuating vibrations generated by the apparatus can be provided.

8 Claims, 3 Drawing Sheets

5,579,084

APPARATUS AND METHOD FOR MANUFACTURING SEMICONDUCTORS

This application is a continuation of application Ser. No. 08/015,382 filed Feb. 9, 1993, now abandoned.

BACKGROUND OF THE INVENTION

FIELD OF THE INVENTION

The present invention relates to an apparatus for manufacturing semiconductors which have become more sensitive year by year. Specifically, the present invention relates to a vibration-proof mechanism of a reduction projection aligner (stepper) having a stage for a step and repeat, or step and scan operation installed therein.

Hitherto, an apparatus of the above type has used a vibration insulation system, as shown in FIG. 4, in order to reduce the influence of floor vibrations where the apparatus is installed. In this system, as floor vibration transmission prevention means, vibrations along the Z axis are prevented by means of an air spring 2 which is vertically suspended by a suspension member 4 so that horizontal vibrations are prevented based on the principle of a pendulum. The inside of an outer suspension casing 6 is filled with viscous fluid 5 in order to improve horizontal damping characteristics. The damping using viscosity resistance is performed by the bottom surface of a suspender which is equivalent to a pendulum and the surface of a container. The rigidity of the air spring along the Z axis can be reduced in this system, and low rigidity of a suspension member can also be assumed horizontally. Furthermore, by using a long suspension member, the characteristic horizontal vibration frequency can also be suppressed to quite a low level. Therefore, this method has been put into practical application in apparatuses as a very effective method for attenuating floor vibrations.

As shown in FIG. 5, a system has recently been developed in which a sensor 22 for detecting vibrations of the apparatus and an active control apparatus 21 for regulating the amplitude of the vibrations is incorporated into a conventional vibration insulation system. However, problems remain to be solved, for example, the apparatus is large, and costs are quite high.

Systems of the above type are generally designed with a view to inhibiting floor vibrations from being transmitted to the apparatus. Usually, such systems are not effective for controlling vibrations generated by the apparatus. That is, the transmission function of a vibration transmission ratio (smaller than 1) for preventing vibrations from being transmitted to the apparatus is in a reverse relation to that of the vibration transmission ratio (smaller than 1) for controlling vibrations generated by the apparatus in frequency regions. Therefore, it may be considered that the reason why such systems are not effective is that conflicting characteristics are needed in a conventional stepper using the vibration insulation system of the above type. Vibration insulation characteristics with respect to floor vibrations have been sacrificed to some extent, and a vibration control effect for controlling vibrations generated by the apparatus is added thereto. However, as semiconductor devices have become more sensitive in recent years, these very small residue vibrations have reached an unacceptable level.

Therefore, since alignment and exposure are performed after residual vibrations are attenuated naturally, the productivity of the apparatus decreases considerably. This is extremely inconvenient. A semiconductor exposure apparatus is disposed on a second or higher floors rather than on the first floor in some recent semiconductor manufacturing factories because it is difficult to secure sites. In some cases, the level of floor vibration is high. In these circumstances, it is necessary to develop a vibration insulation system capable of efficiently and quickly insulating floor vibrations and attenuating vibrations generated by the apparatus.

SUMMARY OF THE INVENTION

The present invention has been achieved in view of the above-described circumstances.

An object of the present invention is to provide an apparatus and method for manufacturing semiconductors capable of preventing floor vibrations from being transmitted to the apparatus and efficiently attenuating vibrations generated by the apparatus.

In the present invention which achieves the above-described object, a sequential relationship between the step and repeat, or step and scan operation, and an alignment or exposure operation is taken into consideration in a semiconductor exposure apparatus having a stage for a step and repeat, or step and scan operation installed therein. A vibration insulation system capable of effectively insulating floor vibrations and attenuating vibrations generated by the apparatus in a short time is switched according to time series so that the characteristics of the above can be utilized to a maximum.

The above is accomplished by an apparatus for manufacturing semiconductors comprising at least one vibration insulation unit, said vibration insulation unit comprising: vibration insulation means having a damper for insulating floor vibrations; and control means for varying damping characteristics of said damper in accordance with the sequence of operations of the apparatus, thereby attenuating vibrations generated by the apparatus.

In order for the system to operate as a conventional one capable of efficiently insulating floor vibrations during an alignment or exposure condition in which no step operation is being performed on the stage, the viscosity attenuation of the damper is weakened so that the vibration transmission ratio from the floor to the apparatus becomes far smaller than 1 in order to reduce the influence of the floor vibrations as much as possible. In contrast, when the stage is being operated in steps, a damper is clamped so as not to work in order to suppress the amplitude of vibrations (shaking) of the apparatus, caused by the step operation; or the viscosity of the viscous fluid used in the damper is increased to increase the viscosity attenuation of the damper.

Since a mechanism for varying damping characteristics is added to conventional vibration insulation apparatuses so that the damping characteristics can be varied in accordance with the sequentially operating state of the apparatus in the present invention, there is an advantage in that deterioration of the performance of the apparatus due to disturbances, such as floor vibrations, is eliminated, and a decrease in productivity due to vibrations generated by the various parts of the apparatus can be prevented. In addition, since sensors, actuators or the like for measuring and/or regulating the vibrating state of the apparatus are not needed, and the vibration preventing mechanism is simple in the present invention, costs can be reduced and highly practical applications thereof are achieved.

A method for manufacturing an apparatus for manufacturing semiconductors comprising at least one vibration insulation unit, comprising the steps of: selecting an apparatus for manufacturing semiconductors having a movable stage; supporting said movable stage on a vibration insulation base having a damper with movable portions for insulating floor vibrations; placing a substrate on said movable stage; moving said substrate during a step operation of said apparatus by means of said movable stage; varying the damping characteristics of said damper by using a viscous liquid; raising the damping characteristics of said damper during the step operation higher than that during non-step operation; and repeatedly performing the step operation each time various parts of the substrate are processed.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DESCRIPTION OF THE PREFERRED EMBODIMENTS

Figure 1:
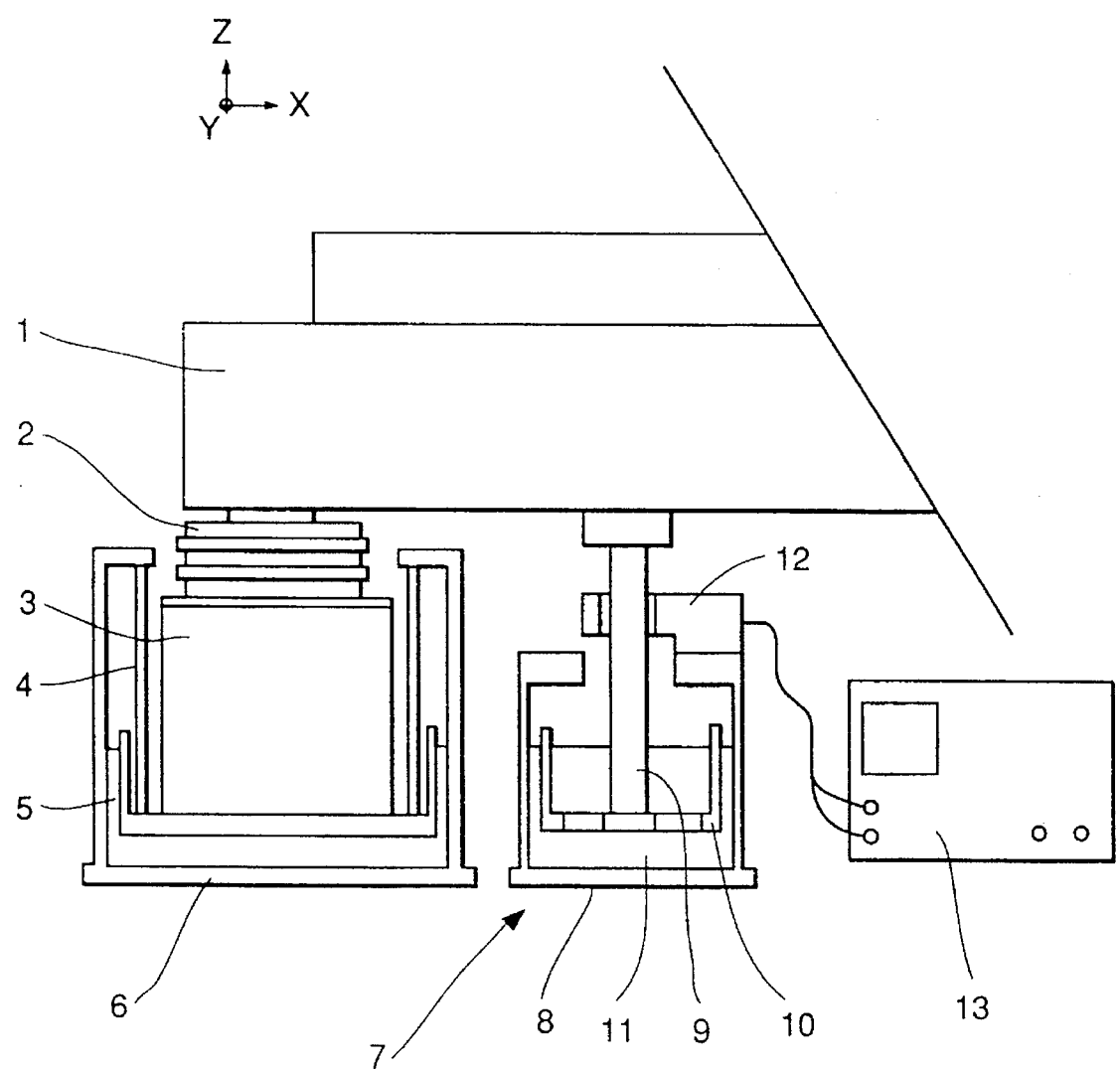
FIG. 1 illustrates the construction of an embodiment of the present invention.

FIG. 1 illustrates the first embodiment of the present invention which is applied to a step and repeat, or step and scan type projection aligner for use in processes for manufacturing semiconductors. A plurality of mount units are used in an actual apparatus. FIG. 1 is a side view of one mount unit. The apparatus of this embodiment comprises an air spring 2 for elastically supporting an apparatus 1 along the Z axis (vertically) in order to prevent floor vibrations at the installation place; a chamber 3 for supplying air to the air spring 2; a suspension member 4 for suspending the vibration-insulating mechanism along the Z axis; an outer casing 6 which fixes the suspension member 4 and which is filled with highly viscous fluid 5 for damping horizontally; and dampers 7 placed side by side which usually improve damping characteristics of the air spring 2 along the Z axis. The damper 7 comprises a damper arm 9 which is fixed to a lower portion of the apparatus and reaches a damper container 8; a damper plate 10 mounted on the lower end of the damper arm 9; highly viscous fluid 11 for damping along the Z axis; a clamping mechanism 12 for fixing the damper arm 9; and a control apparatus 13 for controlling the clamping mechanism.

With the above-described construction, the clamping mechanism 12 for fixing the damper arm 9 is open in order to efficiently insulate vibrations from floors, and the damper 7 is in an operating state. This occurs when a projection aligner for manufacturing semiconductors is used during an operation for aligning a mask on a semiconductor substrate, or during an exposure operation in which a pattern for a semiconductor device on a mask is reduction-projected on a semiconductor substrate and the semiconductor substrate is exposed by illuminating the mask with predetermined illumination light, during which no vibrations are caused inside the apparatus. When the ordinary alignment, exposure or other operation is completed, the control apparatus 13 is actuated just before the stage, which moves in steps, begins to operate, causing the damper arm 9 to be clamped, thereby inactivating the damper 7. Although the air spring 2 does not work in this condition, it has an impact-buffering function during the step operation because the clamp arm is elastic. Thus, vibrations having adverse influences upon the apparatus can be suppressed. In addition, since the clamping mechanism 12 is also capable of clamping horizontally (along the X and Y axes), horizontal vibrations can be suppressed.

Although an example in which the present invention is applied to a projection aligner was explained in this embodiment, the present invention can be applied to an apparatus in which a sequence, requiring the insulating of floor vibrations when a sequential operation progresses, becomes a series with the suppression of initial vibrations as in a step operation in an alignment or exposure operation. Even though the clamping mechanism was described as a completely fixed type mechanism, it is not necessarily a fixed type. It may be made in a semi-fixed state so that the damping effect thereof can be used.

Figure 2:
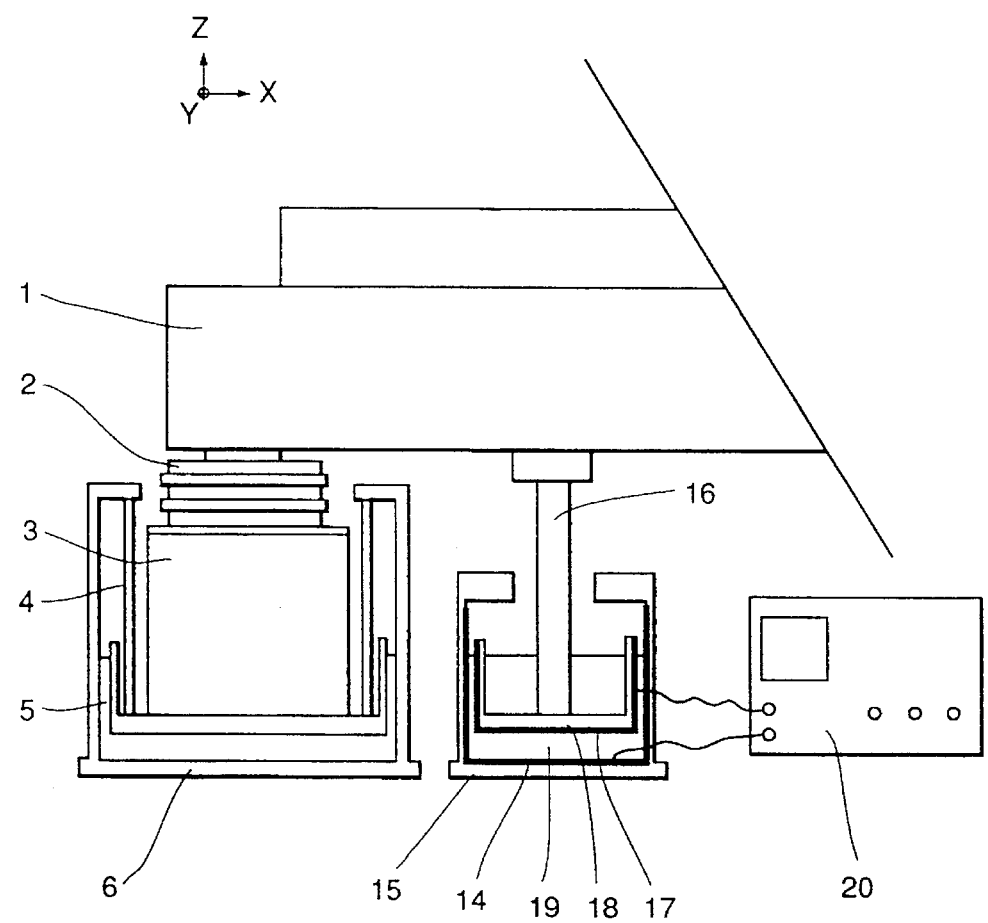
FIG. 2 illustrates the construction of another embodiment of the present invention.
Figure 3:
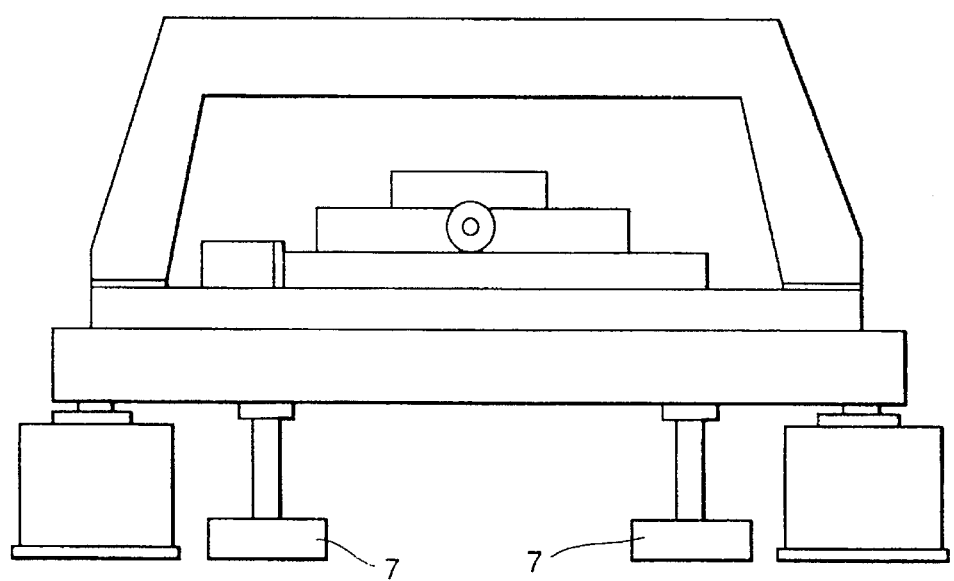
FIG. 3 is a front view of a semiconductor manufacturing apparatus of the present invention.
Figure 4:
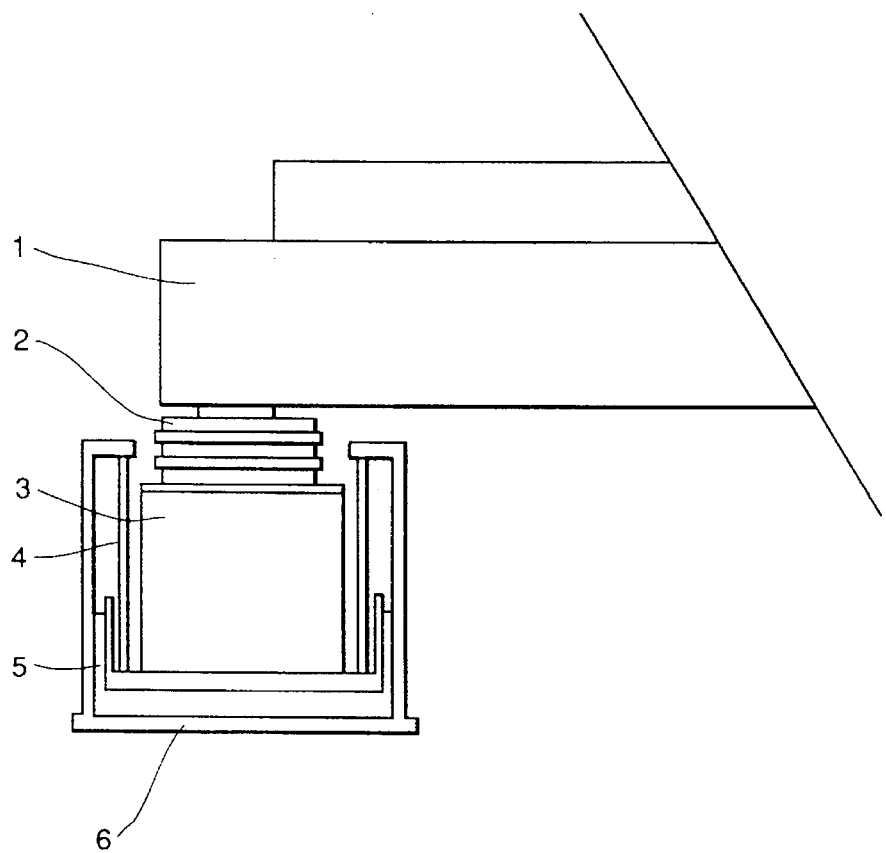
FIG. 4 is a sectional view of a conventional vibration control apparatus.
Figure 5:
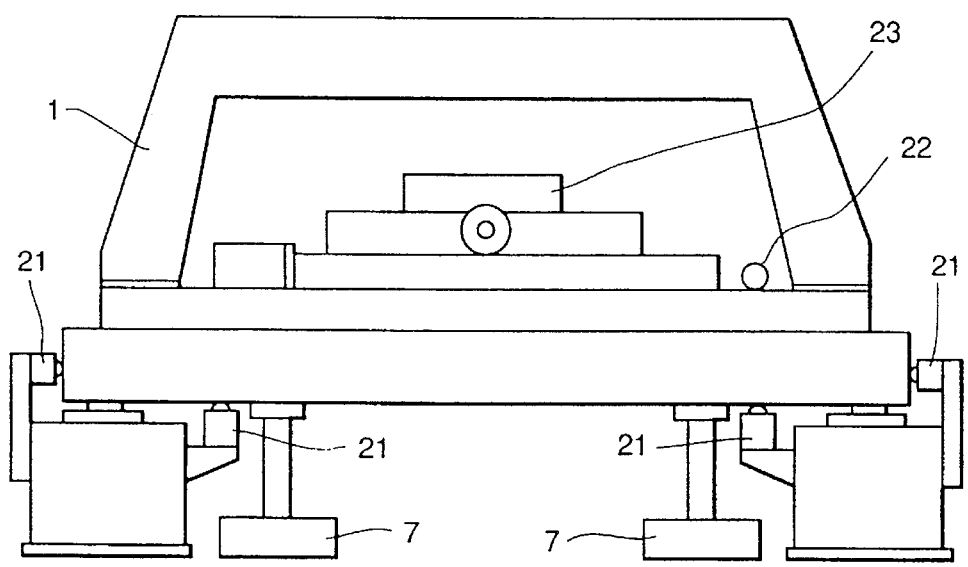
FIG. 5 illustrates the construction of another conventional vibration control apparatus.

FIG. 2 illustrates the second embodiment of the present invention. A plurality of mount units are used in an actual apparatus. FIG. 2 is a side view of one mount unit. FIG. 3 illustrates an example of an actual arrangement thereof. The apparatus of this embodiment comprises an air spring 2 for elastically supporting an apparatus 1 along the Z axis (vertically) in order to prevent floor vibrations at the installation place; a chamber 3 for supplying air to the air spring 2; a suspension member 4 for suspending the vibration prevention mechanism along the Z axis; an outer casing 6 which fixes the suspension member 4 and which is filled with viscous fluid 5 having high viscosity for damping horizontally; and dampers 7 placed side by side which usually improve damping characteristics of the air spring 2 along the Z axis. The damper 7 comprises a damper arm 16 which is fixed to a lower portion of the apparatus and reaches a damper container 15 having an electrode 14 for generating an electric field; a damper plate 18, mounted on the lower end of the damper arm 16, having an electrode 17 for generating an electric field; a magnetic fluid 19 for damping along the Z axis; a power source for applying a voltage to the electrodes and generating an electric field; and a control apparatus 20.

With the above-described construction, when vibrations are not caused in the inside of the projection aligner as in an ordinary alignment operation, exposure operation or the like, no electric current is supplied to the electrodes 14 and 17 mounted on the damper container 15 and the damper plate 18, respectively. The control apparatus is actuated just before the operations either on the stage or on that portion of the inside of the apparatus from which vibrations are generated, causing a predetermined voltage to be applied to the electrodes 14 and 17, and an electric field to be generated. Thus, vibrations generated by the apparatus are suppressed by making the apparent viscosity coefficient of the magnetic fluid larger. In addition, it is possible in this method to vary a voltage applied to electrodes to effectively suppress vibrations according to the amplitude of the vibrations from that portion of the inside of the apparatus from which vibrations are generated. Also, an orifice may be provided to vary the apparent viscosity coefficient of the magnetic fluid.

The present invention can be applied to a wire bonder, a chip inspection apparatus or the like in addition to the above-described projection aligner if the apparatus has installed therein a step and repeat, or step and scan type stage and its operations progress sequentially.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the claims. The following claims are to be accorded a broad interpretation, so as to encompass all such modifications and equivalent structures and functions.

What is claimed is:

1. An apparatus for manufacturing semiconductors comprising:

supporting mechanism for flexibly supporting said apparatus so as to insulate vibrations from a floor;

damping mechanism for damping vibrations of said apparatus relative to said floor, said damping mechanism comprising a movable member vibrating together with said apparatus and a container holding a viscous liquid operating on said movable member said damping mechanism and said supporting mechanism being arranged in parallel between said apparatus and said floor;

clamp mechanism for clamping said movable member in order to substantially fix said movable member relative to said container; and control means for controlling clamp operation of said clamp mechanism in accordance with a sequence of operations of said apparatus, wherein said control means controls said clamp mechanism so as to clamp said movable member when stepwise motion of a semiconductor substrate is performed in said apparatus, cancels clamping said movable member when alignment operation of the semiconductor substrate is performed in said apparatus, and cancels clamping said movable member when exposure operation of the semiconductor substrate is performed in said apparatus.

2. An apparatus for manufacturing semiconductors according to claim 1 wherein said clamp mechanism clamps said movable member mechanically.

3. A method for manufacturing semiconductors, comprising the steps of:

placing a semiconductor substrate on an apparatus for manufacturing semiconductors flexibly supported by a supporting mechanism so as to insulate vibrations from a floor, said apparatus comprising a damping mechanism for damping vibrations of said apparatus relative to said floor, said damping mechanism comprising a movable member vibrating together with said apparatus and a container for holding a viscous liquid operating on said movable member, said supporting mechanism and said mechanism are arranged in parallel between said apparatus and said floor;

clamping said movable member in order to substantially fix said movable member relative to said container when stepwise motion of said semiconductor substrate is performed in said apparatus; and cancelling clamp operation relative to said movable member performed by said clamp mechanism when said semiconductor substrate is exposed in said apparatus.

4. A method for manufacturing semiconductors according to claim 3, wherein said clamp mechanism clamps said movable member mechanically.

5. An apparatus for supporting a movable stage mechanism comprising:

supporting means for flexibly supporting said mechanism so as to insulate vibrations from a floor;

damping means for damping vibrations of said mechanism relative to said floor, said damping means comprising a movable member vibrating with said mechanism and a container holding a viscous liquid operating on said movable member, said damping means and said supporting means being arranged in parallel between said mechanism and said floor;

clamp means for clamping said movable member in order to substantially fix said movable member relative to said floor; and control means for controlling clamp operation of said clamp means in accordance with an operation of said mechanism, wherein said control means controls said clamp means so as to clamp said movable member when a stepwise movement of said mechanism is performed, and to cancel clamping said movable member when the stepwise movement of said mechanism is not performed.

6. An apparatus according to claim 5, wherein said control means controls said clamp means so as to clamp said movable member when the operation of said mechanism is performed.

7. An apparatus according to claim 6, wherein said control means controls said clamp means so as to cancel clamping said movable member when the operation of said mechanism is substantially stopped.

8. A method for displacing a workpiece so as to manufacture a device from the workpiece, comprising the steps of:

placing the workpiece on a movable stage mechanism flexibly supported by supporting means so as to insulate vibrations from a floor, vibrations of said mechanism relative to said floor being damped by damping means, said damping means comprising a movable member vibrating with said mechanism and a container holding a viscous liquid operating on said movable member, said supporting means and said damping means being arranged in parallel between said mechanism and said floor;

clamping said movable member in order to substantially fix said movable member relative to said floor when when the workpiece is stepwise moved by said mechanism;

cancelling clamp operation relative to said movable member when a predetermined process is applied to the workpiece.

* * * * *

UNITED STATES PATENT AND TRADEMARK OFFICE
CERTIFICATE OF CORRECTION

PATENT NO. : 5,579,084

DATED : November 26, 1996

INVENTOR(S) : KAZUO TAKAHASHI ET AL.

It is certified that error appears in the above-indentified patent and that said Letters Patent is hereby corrected as shown below:

COLUMN 5

Line 25,    "member" should read --member,--;
    Line 45,    "claim 1" should read --claim 1,--.

COLUMN 6

Line 55,    "when" should be deleted;
    Line 56,    "nism;" should read --nism; and--.

Signed and Sealed this

Thirteenth Day of May, 1997

Attest:

BRUCE LEHMAN

Attesting Officer      Commissioner of Patents and Trademarks